(12) United States Patent
Dasgupta et al.

(10) Patent No.: US 8,073,894 B1
(45) Date of Patent: Dec. 6, 2011

(54) COMPACT SWITCHED-CAPACITOR FIR FILTER IMPLEMENTATION

(75) Inventors: Uday Dasgupta, Singapore (SG); Qing Chen, Singapore (SG)

(73) Assignee: Marvell International, Ltd., Hamilton (BM)

( * ) Notice: Subject to any disclaimer, the term of this patent is extended or adjusted under 35 U.S.C. 154(b) by 1055 days.

(21) Appl. No.: 11/935,815

(22) Filed: Nov. 6, 2007

Related U.S. Application Data

(60) Provisional application No. 60/865,242, filed on Nov. 10, 2006.

(51) Int. Cl.
*G06G 7/02* (2006.01)
(52) U.S. Cl. ........................................ 708/819
(58) Field of Classification Search ........... 708/819
See application file for complete search history.

(56) References Cited

U.S. PATENT DOCUMENTS 4,633,425 A * 12/1986 Senderowicz ............... 708/819
4,972,436 A * 11/1990 Halim et al. ................ 708/313

OTHER PUBLICATIONS

Lee et al., "A Switched-Capacitor Realization of Multiple FIR Filters on a Single Chip", *IEEE Journal of Solid-State Circuits*, vol. 23, No. 2, pp. 536-542, Apr. 1988.

* cited by examiner

*Primary Examiner* — Tan V Mai

(57) ABSTRACT

A system is provided to perform non-recursive signal processing tasks using a sampled data technique and a network of switched-capacitor filters. The input analog signal is sampled in a time sequence manner at regular time intervals in order to obtain analog-valued samples. These samples are collected into data blocks and the data blocks are assembled into a set of data blocks. The successive data blocks belonging to a set of data blocks partially overlap with the first data block. The non-recursive signal processing is performed on all of the data blocks of the set substantially simultaneously, using a parallel network of switched capacitor filters, in order to produce a processed analog output signal. Each individual processing path of the parallel network of switched capacitor filters processes a specific data block of the set of data blocks. The number of parallel processing paths is the same as one plus the degree of the polynomial representing the desired or overall input/output equation characterizing the non-recursive signal processing. An implementing architecture can be simplified by factorizing the polynomial representing the input/output equation into smaller sized polynomial subtasks that can each be implemented by a sub-system of parallel network of switched capacitor filters of smaller complexity.

14 Claims, 6 Drawing Sheets

COMPACT SWITCHED-CAPACITOR FIR FILTER IMPLEMENTATION

INCORPORATION BY REFERENCE

This application claims benefit of U.S. Provisional Patent Application No. 60/865,242 "Compact Switched Capacitor FIR Filter implementation," filed on Nov. 10, 2006. The disclosure of the priority application is hereby incorporated by reference herein in its entirety.

FIELD OF DISCLOSURE

This disclosure is directed to systems and methods for implementing a compact switched-capacitor FIR filter.

BACKGROUND

Advanced signal processing tasks have become increasingly demanding as technology has advanced. Much of this added demand is based on required and/or desired speeds at which the signal processing is intended to occur. Implementing these signal processing tasks becomes, therefore, more complex as well.

Feedforward processing, rather than feedback processing, can reduce the complexity of signal processing tasks and increase throughput in certain signal processing architectures. This is particularly advantageous in signal processing architectures that include, for example, filters with linear phase or constant group delay requirements. Non-recursive signal processing tasks are a class of such signal processing tasks that are accomplished without any feedback-based signal processing. The input/output equations that characterize non-recursive signal processing approaches represent feedforward relationships between an output signal and an input signal.

Finite impulse response (FIR) filters represent a class of filters most commonly implemented with digital circuits. FIR filters have one or more feedforward paths, but no feedback loops. FIR filters possess other desirable properties such as achieving linear-phase frequency response. FIR filters can employ either digital or analog sampled data techniques. FIR filters differ from infinite impulse response (IIR) filters, which feedback filter states to generate a filtered output.

Sampled data techniques are used to implement signal-processing tasks in a variety of signal processing applications. In these applications, a sampler can sample a signal at discrete and regular time intervals. The signal samples are then processed by any of several techniques, the most common of which are digital signal processing (DSP) techniques. DSP techniques convert analog signal samples into corresponding digital representations and perform arithmetic operations on the digital representations via processing elements such as registers, adders/subtractors and multipliers.

Various FIR implementation schemes are discussed in "A Switched-Capacitor Realization of Multiple FIR Filters on a Single Chip," IEEE Journal of Solid-State Circuits, Vol. 23, No. 2, April 1988. This reference describes differing implementations of FIR filters, cataloging their attendant advantages and disadvantages.

A drawback of many DSP techniques is required conversion of signal samples into a corresponding digital representation using analog-to-digital (A/D) conversion. A/D conversion can severely limit processing speeds. Also, A/D conversion may inaccurately resolve or quantize the signal to a small numbers of bits. Operations performed on resolution-limited data tend to yield outputs with poor signal-to-noise (SNR) ratios. These outputs, when further processed through different filters, yield output signals that have poor reproduced integrity with respect to the input signals. This poor integrity can be a result of limited resolution processing operations resulting from high-speed signal processing constraints. As such, as speeds increase, resolution coincidentally decreases.

Additionally, if analog output signals are required, digital representations of output samples computed by DSP-based signal processing systems must be re-converted into an equivalent analog signal via digital-to-analog (D/A) conversion techniques. Requiring D/A conversion components adds complexity, tends to increase power consumption and cost, further contributes to signal distortion, and results in further limitation to system signal-processing speed.

A variety of signal processing implementation options that do not convert analog samples into equivalent digital representations exist. These implementation techniques process analog-valued samples to varying accuracies at increasingly high speeds. Two of these signal-processing implementations as described in the above-cited reference are Charge Coupled Device (CCD) based implementations, and analog Complementary Metal Oxide Semiconductor (CMOS) Switched-Capacitor (SC) based sampled-data implementations.

As indicated in the above-cited reference, signal processing implementations that are based on CCD technology are less attractive than SC implementations in that they tend to require non-standard processing technologies that often make them expensive and somewhat difficult to implement. CCD technology based solutions also tend to suffer by limiting dynamic range due to difficulty in, among other shortfalls, realizing output charge-to-voltage conversion amplifier.

Implementations based on SC devices have gained wider acceptance in achieving even higher speeds than those that are achievable with other DSP-based sampled data techniques. SC device based implementations tend to have larger dynamic ranges as compared to those of CCD technology based implementations. CMOS implementations offer very mature, cost effective technology solutions, which can enable further improvements in signal processing speeds and/or operating rates. Speed improvements made possible by CMOS technology based solutions can also be realized through reductions in physical dimensions of transistors and reductions in line widths for inter-circuit element connections. CMOS based sampled data techniques are also advantageous because they require no A/D or D/A conversion, thereby simplifying circuit design. Resulting semiconductor fabrication steps for these circuits also tend to be much less specialized than those conventionally required for CCD based implementations.

Sampled-data, non-recursive signal processing tasks find wide utility for applications in spectral analysis, radar signal processing, image compression, and spread spectrum communications. Some of these applications benefit from using Finite Impulse Response (FIR) filters for which the duration of the filter impulse response is are based on the above-mentioned advantages. In contrast to non-recursive or IIR filters, FIR filters can be designed to have a linear phase response, i.e., for each given frequency, the phase of the filter output, relative to the filter input at that frequency, is proportional to frequency. Linear phase filters include constant group delays and symmetric impulse responses. Linear phase characteristics are desirable in applications that are particularly sensitive to phase distortion. For example, a linear phase characteristics are desirable for applications that use Discrete Fourier Transforms (DFT) or the Discrete Cosine Transforms (DCT).

Switched-capacitor (SC) filter technology based implementations of the FIR filters can operate at a given sampling frequency, $F_s$, and over a given sampling period, where the sampling period is a reciprocal of the given sampling frequency. To recap, switched-capacitor (SC) FIR filters tend to: (1) be faster, (2) offer higher dynamic range, (3) be more power-efficient, and (4) be more compact, particularly in comparison to other sampled data techniques. For example, at the very high speed end of the range, such as for applications at Giga-Samples per Second (GSPS), SC based solutions can realize these processing speeds with better output signal integrity, as measured by one or more characteristics such as signal to noise ratio, dynamic range, or signal and noise cross spectral density, compared to other Digital Signal Processing (DSP) based solutions. SC based solutions do not require analog-to-digital (A/D) or digital-to-analog converters; thereby eliminating quantization noise and reducing cost. A/D converters used for very high-speed signal processing applications, for example, can be very expensive even at a precision of just a few bits (2 or 3 bits/sample). The SC based solutions have smaller footprint and can be implemented using mature, low power and high speed CMOS technology.

An additional advantage as compared to CCD-based implementation is that the SC based solution is easier to integrate on an Application Specific Integrated Circuit (ASIC). Unlike CCD technology solutions, SC based solutions do not require expensive non-standard semiconductor processing steps that tend to be incompatible with ASICs. However, currently available filter implementations based on SC technologies use designs and methods that include a more complex mix and number of circuit elements typically result in increased semiconductor die size, power consumption, and cost, and can thus decrease operating frequency or speed. For example, the size and complexity of analog multiplexers needed in some SC filter designs can increase rapidly as a number of filter coefficients increases.

SUMMARY

The earlier-cited reference describes, in detail, an $N^{th}$-order switched-capacitor FIR filter. The conventionally described structure, however, requires several varied hardware elements including, but not limited to, buffer amplifiers following sample-and-hold elements and/or analog multiplexers. While realizing the above-noted benefits of switched-capacitor FIR filters, the discussed implementations can be more complex, slower, and require a larger footprint on the semiconductor die than can be realized through certain implementing techniques.

It would be advantageous to provide an FIR filter architecture that takes even greater advantage of switched-capacitor implementations while further simplifying overall system design through unique structural system design.

This disclosure is directed to systems and methods for implementing FIR filters, based on SC technology that remove a requirement for, and structure including, conventional buffer amplifiers. Exemplary implementations may combine sample-and-hold circuit and analog multiplexer functions with a summing amplifier to achieve, among other advantages, the above-described simplifying design objectives. This disclosure proposes SC filter technology based architectures to implement FIR filters more simply than in conventional designs. These architectures may provide circuit designs that are modular for efficient ASIC-based implementations.

In various exemplary embodiments, the systems and methods according to this disclosure may provide data blocks that are formed by collecting a number of discrete input signal samples based on the order, N of an FIR filter. The FIR filter order N may represent a number one less than a number of coefficients in the FIR filter input/output equation. In other words, N+1 coefficients may be used to represent the filter so that a present sample, plus N previous samples of the input signal, is used to compute each output sample. The filter order N may equal the degree or order of a polynomial that represents the FIR filtering operation. The analog input signal from an analog signal source may be sampled in a time sequence manner at regular time intervals in order to obtain analog-valued samples as discrete-time input signal samples.

In various exemplary embodiments, the systems and methods according to this disclosure may assemble sets of data blocks such that each set of data blocks includes a number of data blocks that is based on the same order, N, of the FIR filter. In a specific exemplary embodiment, the number of data blocks in a set of data blocks may be exactly N+1, and each data block may have exactly N+1 analog-valued signal samples.

In various exemplary embodiments, each successive data block of a specific set of data blocks may be offset, in time, in relation to each data block in the set such that the successive data blocks are partially overlapping with the first data block. Each data block in the set may partially overlap an immediately preceding data block by aligning a first analog-valued sample of each data block with a second analog-valued sample of an immediately preceding data block.

In various exemplary embodiments, the systems and methods according to this disclosure may process all of the data blocks belonging to a set of data blocks substantially simultaneously via parallel processing paths. All of the parallel processing paths may be implemented using a network of switched-capacitor filters. The number of parallel processing paths may be equal to one plus the degree N of the polynomial that represents the FIR filtering operation, i.e., N+1. Each parallel processing path may be configured to process one data block individually and independently.

In various exemplary embodiments, the systems and methods according to this disclosure may allow all of the data blocks belonging to one set to be processed substantially simultaneously by parallel processing paths. Each of the individual parallel processing paths may be composed of multiple switched-capacitor filter sections. The number of such sections may be equal to one plus the degree N of a polynomial that represents the FIR filtering operation.

In various exemplary embodiments, the systems and methods according to this disclosure may operate such that successive data blocks may be processed by a specific parallel processing path that may belong to successive sets of data blocks. A $j^{th}$ data block of any set of data blocks may be processed via a $j^{th}$ parallel processing path where j is an integer such that $0 \leq j \leq N$.

In various exemplary embodiments, the systems and methods according to this disclosure may provide each of N+1 switched-capacitor filter sections, belonging to a particular parallel processing path, to process a specific analog-valued sample belonging to a data block that corresponds to the particular parallel processing path. As an example, a $k^{th}$ analog-valued sample belonging to a $j^{th}$ data block, of any set of data blocks, may be processed by an $k^{th}$ switched-capacitor filter section of a $j^{th}$ parallel processing path where $0 \leq j \leq N$ and $0 \leq k \leq N$. Signal processing by any switched-capacitor filter section may be executed as a multiplication function on an analog-valued sample by a constant that may represent an FIR filter coefficient.

In various exemplary embodiments, the systems and methods according to this disclosure may combine sample-and-hold (S/H), and analog multiplexing, functions with a summing amplifier to reduce a need for, and/or otherwise eliminate buffer amplifiers.

In various exemplary embodiments, the systems and methods according to this disclosure may decompose a non-recursive signal-processing task into a plurality of individual non-recursive signal processing sub-tasks such that each of the sub-tasks is individually related to, and of smaller complexity than, the original non-recursive signal-processing task.

These and other objects, advantages and features of disclosed exemplary systems and methods are described in, or apparent from, the following description of embodiments.

BRIEF DESCRIPTION OF THE DRAWINGS

Exemplary embodiments of disclosed systems and methods for implementing a non-recursive signal processing task will be described, in detail, with reference to the following drawings, wherein.

DETAILED DESCRIPTION OF EMBODIMENTS

The following detailed description relates to various exemplary embodiments of systems and methods for implementing non-recursive signal processing for very high-speed applications using sampled-data techniques. The disclosed systems and methods are designed around switched-capacitor (SC) filter based parallel processing paths. Processing speed and accuracy are maintained and potentially improved while design and implementation of the processing circuit are uniquely simplified.

Figure 1:
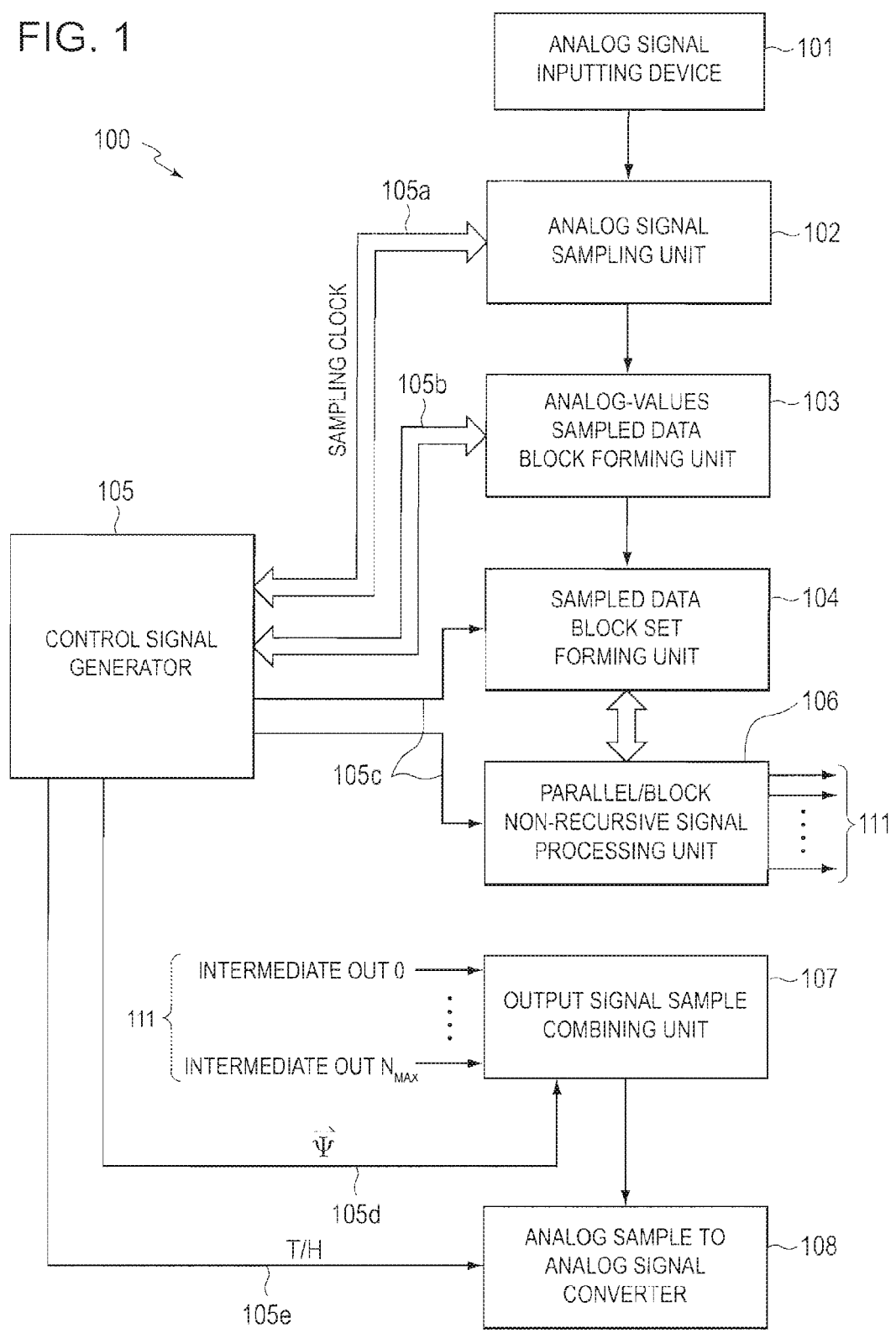
FIG. 1 schematically illustrates a block diagram of an exemplary embodiment of a system for implementing a non-recursive signal-processing task using multiple parallel processing paths.

FIG. 1 schematically illustrates a block diagram of an exemplary embodiment of a system for implementing a non-recursive processing task using multiple parallel processing paths. As shown in FIG. 1, the exemplary system 100 may include an analog signal inputting device 101 that accepts a signal from an analog signal source (not shown), an analog signal sampling unit 102, an analog-valued sampled data block forming unit 103, a sampled data block set forming unit 104, and a control signal generator 105. The control signal generator 105 may generate sampling control signals or interleaved timing pulses to one or more of the individual sampling devices within the analog signal sampling unit 102, the sampled data block set forming unit 103 or otherwise through the system 100 to provide sampled data synchronization. The exemplary system 100 may also include other components for signal processing as follows. A parallel/block non-recursive signal processing unit 106 may be provided for parallel processing of individual sampled data block sets, an output signal sample combining unit 107 may take individual intermediate outputs in parallel from each of parallel information paths of the parallel/block non-recursive signal processing unit 106 and combine signals from the parallel information paths as a set of discrete-time analog samples. Each analog sample may then be forwarded to an analog sample-to-analog signal converter 108. This converter 108 may receive clocking or clock pulse input from the control signal generator 105 to convert the analog samples to an output analog signal. The output analog signal is, therefore, the result of a non-recursive or FIR filter that processes the input signal.

The control signal generator 105 of exemplary system 100 may generate, for example, sampling clock pulses 105a that sample or capture analog signals, which are from an analog signal source, by the analog signal inputting device 101 at discrete times. The sample times can be integer multiples of the reciprocal of a sampling frequency, $F_s$. Control signal generator 105 may also generate control or timing pulses 105b and 105c that aggregate the results of sampled or captured analog signals in a block and weight a sequence of blocks by periodically addressed sets of weights arranged in parallel paths.

The overall operation of the analog signal sampling unit 102, analog-values sampled data block forming unit 103, sampled data block set forming unit 104, and parallel/block non-recursive signal processing unit 106 may constitute a pipelining system that receives a sequence of timing pulses from control signal generator 105, and stores and delays multiple streams of copies of samples of the input signal from analog signal inputting device 101 to process the multiple streams of copies of samples in a series of filter stages. The processing of each filter stage can be a sub-task of a sequence of non-recursive signal processing tasks.

Weighted samples from block set forming unit 104 and parallel block non-recursive signal processing unit 106 may be transferred and simultaneously processed as intermediate outputs 111 to output signal sample combining unit 107. Parallel block non-recursive signal processing unit 106 may produce an output for each of M filter stages, for which the maximum number of parallel paths is $N_{max}$.

Output signal sample combining unit 107 may be, for example, a gated operational amplifier that receives a gating signal ($\Psi$) 105d for each filter stage. Multiple filter stages may constitute a series of subsystems that may implement a filter polynomial that is larger or more complex than a filter polynomial for any of the subsystems or stages. The combined output signal samples may be converted from the sampled data domain, i.e. data pulses, to the analog signal domain, i.e., continuous or piecewise continuous signals, in synchronization with a timing track and hold (T/H) signal 105e from control signal generator 105.

Figure 2:
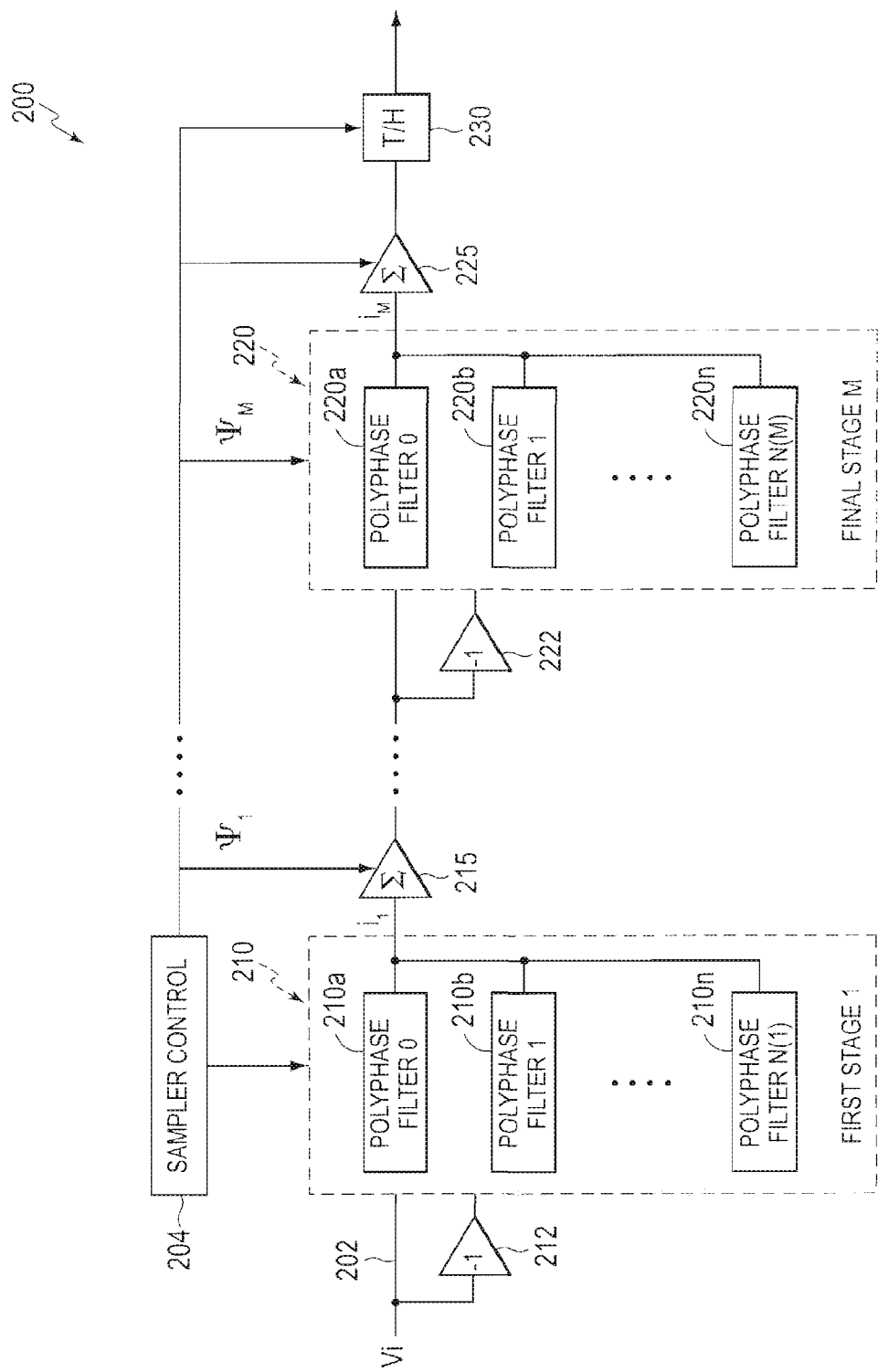
FIG. 2 schematically illustrates an exemplary embodiment of a compact switched-capacitor FIR filter according to this disclosure.

FIG. 2 schematically illustrates an exemplary embodiment of a compact switched-capacitor FIR filter 200. As shown in FIG. 2, the compact switched-capacitor FIR filter 200 may include a signal input line 202, a sampler controller 204, inverting amplifiers 212 and 222, a first stage polyphase filter bank 210, summing amplifiers 215 and 225, a final stage polyphase filter bank 220, and a track and hold (T/H) amplifier 230. The compact switched-capacitor FIR filter 200 may include one or more polyphase filter banks arranged in series from input line 202 to the input of T/H amplifier 230. Polyphase filter banks may be cascaded or staged sequentially in their order of signal flow. Each polyphase filter bank may be described as an even or an odd filter bank or stage, starting with polyphase filter bank 210, which is an odd filter bank, i.e., the first filter bank. Polyphase filter bank 220 may be either even or odd, depending on the presence of any intermediate or cascaded filter stages.

The number of filter stages, M, and the polynomial degree or order, N(m), assigned to the $m^{th}$ filter stage may be determined by factoring a polynomial such that:

$$D = \sum_{m=1}^{M} N(m), \quad \text{(Equation 1)}$$

where D is the degree of the polynomial that describes the desired or overall filter transfer function.

As an example, a desired transfer function may be described with 33 coefficients, to implement a $32^{nd}$ degree polynomial, e.g., D=32. The $32^{nd}$ degree polynomial can be implemented with eight stages of fourth order filters, i.e., N=4. Alternatively, the same polynomial can be implemented with sixteen stages of second order filters, i.e., N=2. In these exemplary cases, there may be N+1, i.e., 5 or 3, polyphase filters per stage, respectively.

Polyphase filter bank 210 may contain a parallel array of filters, called polyphase filters. There may be N+1 polyphase filters per polyphase filter bank where N may be allowed to vary from stage to stage. For the first stage polyphase filter bank 210, the number of polyphase filters may be represented as N(1)+1. Likewise, polyphase filter bank 220 may contain N(M)+1 polyphase filters, where M may denote the total number of filter stages. It should be appreciated that more than two filter stages, indexed by a variable m, may be present in an embodiment of the compact switched-capacitor FIR filter 200 and that M may be either even or odd.

Table 1 provides an exemplary set of definitions of certain indices and other variables used in describing the exemplary compact switched-capacitor FIR filter 200 shown in FIG. 2, and in describing various elements shown in FIGS. 3-6.

TABLE I

| SYMBOL | DESCRIPTION |
| --- | --- |
| | Symbol Definitions |
| M | Number of Filter Stages |
| m | Stage index m = 1, . . . , M, arranged from input, m = 1, to output, m = M |
| N(m) | Filter Order for $m^{th}$ stage; N(m) is less than or equal to D |
| k | Storage element index of k = 0, . . . , N(m) |
| j | Polyphase filter index j = 0, . . . , N(m) |
| $S_{j,k,m}$ | Sign selector for multiplexer/FIR filter storage element |
| $(C/C_F)_{j,k,m}$ | FIR filter or filter storage element coefficient magnitude |

Input to polyphase filter bank 210 may be provided by both an input signal line 202 and an inverted signal from inverting amplifier 212. Output from polyphase filter bank 210 may be converted from a charge, i.e., an integrated current, to a voltage by summing amplifier 215. Sampling and control pulses are provided by sampler control 204 to both polyphase filter bank 210 and summing amplifier 215. The output of summing amplifier 215 can be controlled by timing control signals, such as a plurality of timed pulses with prescribed relative inter-pulse times, from sampler control 204.

Polyphase filter bank 220 may receive non-inverted and inverted signals from summing amplifier 215. Inverter 222 may generate an inverted version of the signal from summing amplifier 215 and supply the inverted signal to polyphase filter bank 220. The output of polyphase filter bank 220 may be provided to summing amplifier 215. Timing control signals, such as timed pulses, from sampler controller 204 may be provided to both polyphase filter bank 220 and summing amplifier 225.

The output of summing amplifier 225 can be tracked and held by T/H amplifier 230. T/H amplifier 230 may track or follow an input signal during a track interval and may hold the most recent tracked signal during a hold interval. In other words, the T/H amplifier 230 may provide a zero-order hold characteristic. T/H amplifier 230 may also implement a higher order hold characteristic, e.g., a first-order hold, which may generate an output signal that is a linear extrapolation from the previous two samples.

The track interval and hold interval of the T/H amplifier 230 may be framed or encompassed by timing control pulses supplied by sampler controller 204. The track interval and hold interval might not be equal in duration. The track interval may constitute, for example, one fifth to one tenth of a sampling period, and the hold interval may constitute the other four-fifths to nine-tenths of the sampling period.

The exemplary compact switched-capacitor FIR filter 200 may operate by processing one or both of the input signal 202 and/or the inverted input signal from inverting amplifier 212 in one or more filter stages. The filter stages can be numbered from 1 to M in the order of signal flow from the signal input line 202 to the output of T/H amplifier 230. The number of polyphase filters in each filter stage may be dependent on a stage number variable, m. Each stage of compact switched-capacitor FIR filter 200 may operate with identical physical principles but with an independent number of polyphase filters and corresponding, stage-dependent timing pulses or control signals.

Sampler controller 204 may supply timing pulses or control signals that can be denoted as φ-type and θ-type indicating (1) sampling and holding, or sampler, commands, and (2) outputting commands, respectively. The sampler and outputting commands may also be referred to as series switch or shunt switch control pulses, respectively. A series switch control pulse may cause an element within a polyphase filter in a polyphase filter bank to sample a non-inverted input signal on input signal line 202, or an inverted signal from inverter amplifier 212.

Figure 4:
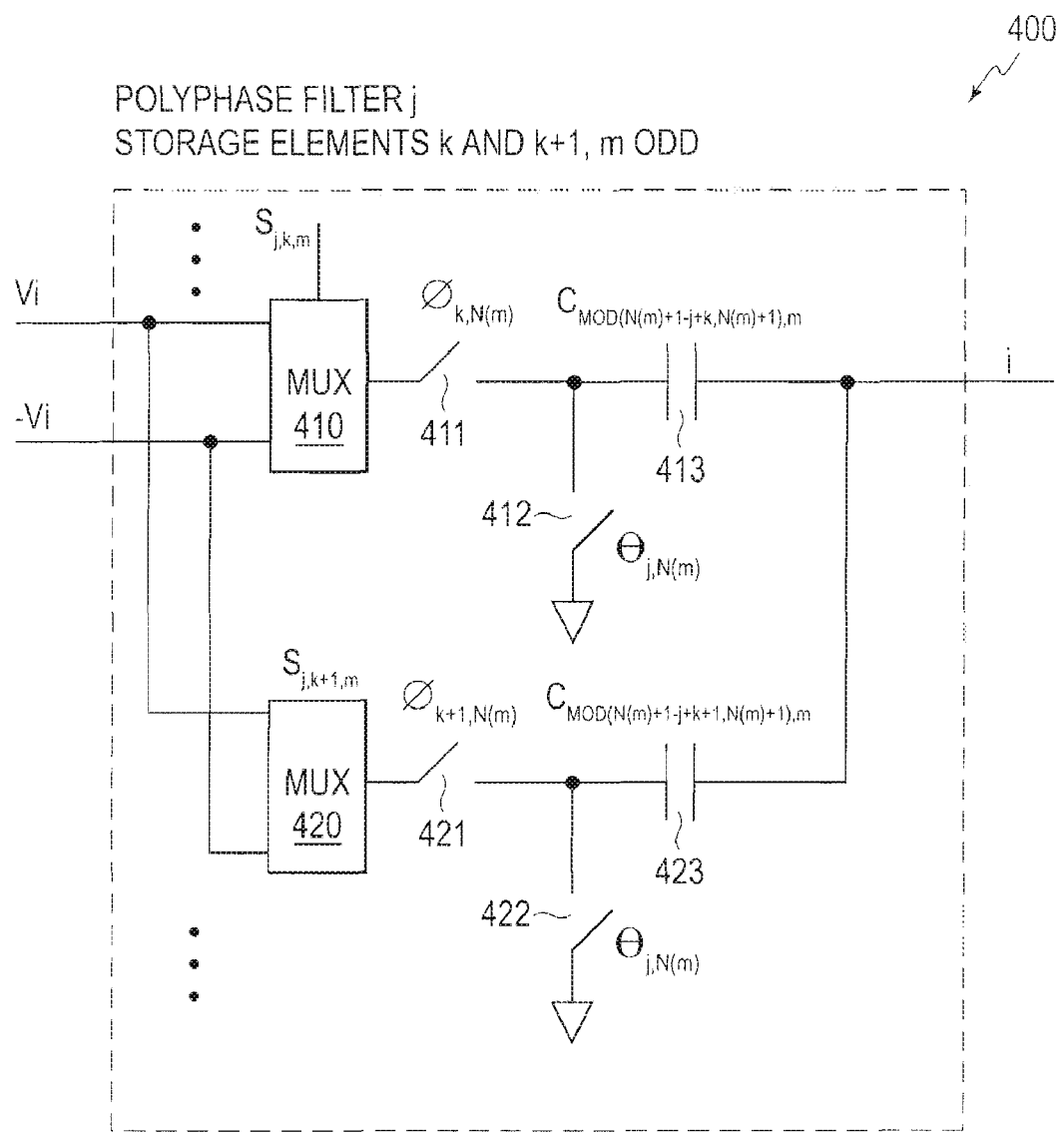
FIG. 4 schematically illustrates $k^{th}$ and $(k+1)^{th}$ elements of a $j^{th}$ polyphase filter for an $m^{th}$ filter stage where m is odd.
Figure 5:
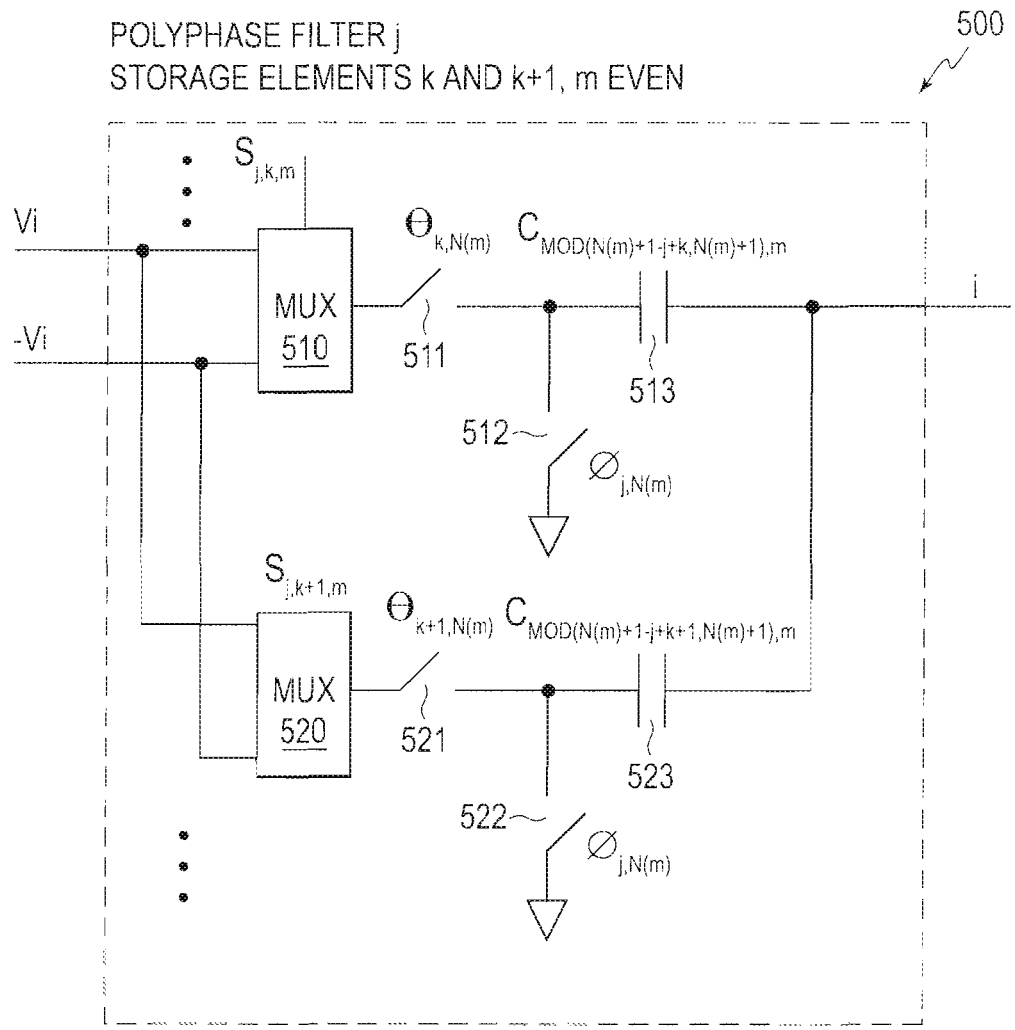
FIG. 5 schematically illustrates $k^{th}$ and $(k+1)$ elements of a $j^{th}$ polyphase filter for an $m^{th}$ filter stage where m is even.

The φ-type and θ-type signals may cause a given polyphase filter bank to implement sampling and outputting for odd polyphase filter banks or the converse for odd and even polyphase filter banks, respectively. In other words, for polyphase filter banks in odd-numbered stages, φ may cause sampling for a given polyphase filter bank and θ may hold and output signals from the given polyphase filter bank. The shunt switch control pulse, θ, can cause an element within a given polyphase filter in an odd numbered polyphase filter bank to cease sampling a non-inverted or inverted signal, then output and hold a given element's contribution to the output of the summing amplifier 215. Conversely, an even stage polyphase filter bank can use θ for sampling and φ for outputting. Alternating the roles of φ and θ between stages can cascade signals from stage-to-stage in a manner that can eliminate or obviate inter-stage buffer amplifiers or track and hold circuits. FIGS. 4 and 5 provide further discussion of the control signals for odd and even numbered polyphase filter banks or filter stages.

A given switch command pulse type, φ, can be associated with a given switch command pulse type, θ, and the two pulse types may have a definite delay relationship. A θ puke may lead or precede a φ pulse by approximately one-half a sampling period. A θ pulse may lead or precede a φ pulse by more than the width of the θ pulse. In either of these exemplary cases, the θ pulse and the φ pulse may be non-overlapping. The pulses of each type may be dependent on the filter stage, the polyphase filter within a stage, and/or an element within the polyphase filter.

Figure 3:
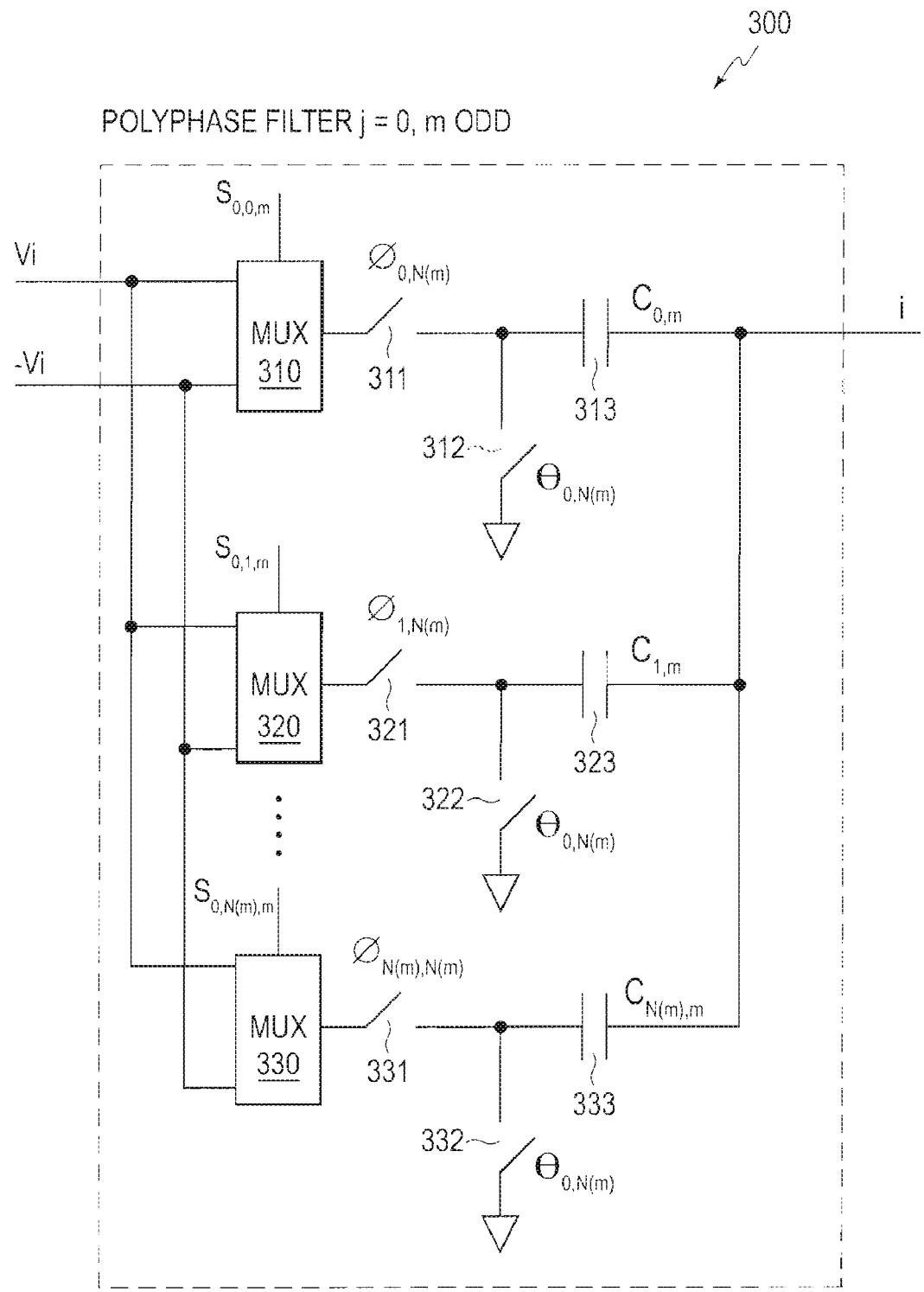
FIG. 3 schematically illustrates a polyphase filter for phase j=0 shown in FIG. 3.

FIG. 3 schematically illustrates a polyphase filter 300 within an odd numbered polyphase filter bank such as either or both of those shown in FIG. 2. The exemplary polyphase filter 300 may correspond to polyphase filter 210a of polyphase filter bank 210 shown in FIG. 2. The exemplary polyphase filter 300 may be assigned a filter phase of j=0. As shown in FIG. 3, input signals $V_i$ and $-V_i$ may be provided to a set of two-input multiplexers, with one multiplexer for each element of the polyphase filter 300. For example, multiplexer 310 may select and provide either an inverted or a non-inverted signal to series switch 311. Series switch 311 may route the selected signal to both the sampling capacitor 313 and to the shunt switch 312. Shunt switch 312 may connect a terminal of the sampling capacitor 313 to ground, i.e., shunt that terminal to ground. In like manner, other elements of polyphase filter 300 may receive the input signal or the inverted input signal on multiplexers 320, 330 sample the selected signal using sampling switches 321, 331 and connect sampled signals to both sampling capacitors 323, 333 and shunt switches 322, 332, respectively. Each multiplexer 310, 320, 330, may receive a control signal, respectively, $S_{0,0,m}$, $S_{0,1,m}$ and $S_{0,N,m}$, corresponding to sampling capacitors $C_{0,m}$, $C_{1,m}$ and $C_{N,m}$, i.e. sampling capacitors 313, 323, 333. Sampling capacitors 313, 323, 333 may each supply signals to a summing junction that may constitute an output of polyphase filter bank 300.

Each sampling capacitor 313, 323, 333, shown in FIG. 3, may have an associated sign selector variable, S. Each sampling capacitor 313, 323, 333 may be arranged so that sampling signals $\phi_{0,N(m)}$, $\phi_{1,N(m)}$, ... $\phi_{N(m),N(m)}$ sequentially sample the input signal or an inverse of the input signal at unit sample period intervals. Likewise, signals $\theta_{0,N(m)}$, $\theta_{1,N(m)}$, ... $\theta_{N(m),N(m)}$ may cause the charge on sampling capacitors 313, 323, 333, respectively, to sequentially contribute to an output of polyphase filter 300 and subsequently to the output of a summing amplifier, such as that depicted as element 215 in FIG. 2.

It should be appreciated that, for an odd-numbered filter stage, cyclic permutation of sampling signals φ may cause the output of a polyphase filter to advance or retard in group delay. In other words, a set of sampling phases, such as $\phi_{0,N(m)}$, $\phi_{1,N(m)}$, ... $\phi_{N(m),N(m)}$, may generate or form a data block of samples. Each polyphase filter may weight the samples in the data block in proportion to a capacitance of a respective sampling capacitor. A cyclic permutation of sampling signals with respect to sampling capacitors in successive polyphase filters within a polyphase filter bank may cause a plurality of data blocks to be assembled such that each successive data block is offset overlapped in time, i.e., staggered, with each other data block. The time offset may be one sample period. In other words, each successive polyphase filter, or phase of a polyphase filter bank, may be delayed or advanced relative to an adjacent neighbor by one sample period.

FIG. 4 schematically illustrates a polyphase filter j for an odd-numbered filter stage and two storage elements k and (k+1) within polyphase filter j. FIG. 4 provides more general notation for the elements of FIG. 3, which covers the j=0 polyphase filter for an odd-numbered filter stage. Elements of FIG. 4 that correspond to elements of FIG. 3 include multiplexers 410 and 420, sampling switches 411 and 421, shunt switches 412 and 422, and sampling capacitors 413 and 423.

FIG. 4 shows the $k^{th}$ polyphase and $(k+1)^{th}$ signal storage elements of the $j^{th}$ polyphase filter for one of the filter stages, such as filter stage "m", of compact switched-capacitor FIR filter 200 shown in FIG. 2. Signs of input signals may be selected by selector $S_{j,k}$. Each $S_{j,k}$ is stage dependent and may most generally be denoted $S_{j,k,m}$. Sampling control of sampling switch 411 may be provided by a clock signal $\phi_{k,N(m)}$. Shunt switch 412 control may be provided by shunt signal $\theta_{j,N(m)}$, and sampling capacitor 413 may be denoted by $C_{MOD(N(m)+1-j+,N(m)+1),m}$. The sign selector corresponding to the $C_{MOD(N(m)+1-j+k,N(m)+1),m}$ sampling capacitor may be denoted by $S_{MOD(N(m)+1-j+k,N(m)+1),m}$ or by $S_{j,k,m}$. The MOD operation causes circular or modular indexing so the index address, $N(m)+1-j+k$, is constrained to the range:

$$0 \leq N(m)+1-j+k \leq N(m) \quad \text{(Equation 2)}$$

FIG. 5 shows a polyphase filter j for an even-numbered filter stage and two storage elements, the $k^{th}$ and $(k+1)^{th}$, within polyphase filter j. FIG. 5 differs from FIG. 4 only in the interchange of the sampling and outputting control signals. Accordingly, the polyphase filter shown in FIG. 5 can be placed in even-numbered filter stages.

Tables 2-6 provide exemplary cases of one and two stage sample data filter designs in the compact switched-capacitor FIR filter. Tables 2-6 provide certain design values for implementations of a single stage low pass differentiator, a single stage low pass filter, a single stage narrow band Hilbert transformer, and a two-stage low pass differentiator.

The following low pass sample data filter design is for a single stage, five coefficient implementation of a low pass differentiator, i.e., m=M=1 and N(m)+1=5. The coefficients of low pass differentiators may be viewed as a composite of the coefficients of a low pass filter and those of a wideband differentiator. Low pass digital differentiators may be used to measure a slope of a curve and reject wideband noise in the slope measurement. The coefficients of Table 2 may implement a low pass differentiator with a nearly ideal differentiation characteristic up to a fraction, e.g., about 15%, of a sampling frequency. In other words, the input signal may be smoothed by the lowpass filter and the smoothed signal may then be differentiated. The sample filter represented by the coefficients in Table 2 contains five coefficients, of which the center coefficient may be zero. These exemplary coefficients can be implemented using a coefficient magnitude and a sign of the coefficient. This can eliminate the need for a negative impedance converter. Each coefficient magnitude may be the ratio of a sampling capacitor and a feedback capacitor for a given stage.

TABLE 2

Single Stage Low Pass Differentiator

| 1 Stage m | 2 Poly-Phase j | 3 Sampled Data Element k | 4 Filter Tap # Mod(N(m) + 1 − j + k, N(m) + 1) | 5 Coefficient Sign $S_{j,k,m}$ | 6 Coefficient Magnitude $(C/C_F)_{j,k,m}$ | 7 Sampling Phase $\phi_{k,N(m)}$ | 8 Output Phase $\theta_{j,N(m)}$ |
|---|---|---|---|---|---|---|---|
| 1 | 0 | 0 | 0 | 1 | 0.069 | φ0 | θ0 |
| 1 | 0 | 1 | 1 | 1 | 0.384 | φ1 | θ0 |
| 1 | 0 | 2 | 2 | 1 | 0 | φ2 | θ0 |
| 1 | 0 | 3 | 3 | −1 | 0.384 | φ3 | θ0 |
| 1 | 0 | 4 | 4 | −1 | 0.069 | φ4 | θ0 |
| 1 | 1 | 0 | 4 | −1 | 0.069 | φ0 | θ1 |
| 1 | 1 | 1 | 0 | 1 | 0.069 | φ1 | θ1 |
| 1 | 1 | 2 | 1 | 1 | 0.384 | φ2 | θ1 |
| 1 | 1 | 3 | 2 | 1 | 0 | φ3 | θ1 |
| 1 | 1 | 4 | 3 | −1 | 0.384 | φ4 | θ1 |
| 1 | 2 | 0 | 3 | −1 | 0.384 | φ0 | θ2 |

TABLE 2-continued

Single Stage Low Pass Differentiator

| 1 Stage m | 2 Poly-Phase j | 3 Sampled Data Element k | 4 Filter Tap # Mod(N(m) + 1 − j + k, N(m) + 1) | 5 Coefficient Sign $S_{j,k,m}$ | 6 Coefficient Magnitude $(C/C_F)_{j,k,m}$ | 7 Sampling Phase $\phi_{k,N(m)}$ | 8 Output Phase $\theta_{j,N(m)}$ |
|---|---|---|---|---|---|---|---|
| 1 | 2 | 1 | 4 | −1 | 0.069 | $\phi_1$ | $\theta_2$ |
| 1 | 2 | 2 | 0 | 1 | 0.069 | $\phi_2$ | $\theta_2$ |
| 1 | 2 | 3 | 1 | 1 | 0.384 | $\phi_3$ | $\theta_2$ |
| 1 | 2 | 4 | 2 | 1 | 0 | $\phi_4$ | $\theta_2$ |
| 1 | 3 | 0 | 2 | 1 | 0 | $\phi_0$ | $\theta_3$ |
| 1 | 3 | 1 | 3 | −1 | 0.384 | $\phi_1$ | $\theta_3$ |
| 1 | 3 | 2 | 4 | −1 | 0.069 | $\phi_2$ | $\theta_3$ |
| 1 | 3 | 3 | 0 | 1 | 0.069 | $\phi_3$ | $\theta_3$ |
| 1 | 3 | 4 | 1 | 1 | 0.384 | $\phi_4$ | $\theta_3$ |
| 1 | 4 | 0 | 1 | 1 | 0.384 | $\phi_0$ | $\theta_4$ |
| 1 | 4 | 1 | 2 | 1 | 0 | $\phi_1$ | $\theta_4$ |
| 1 | 4 | 2 | 3 | −1 | 0.384 | $\phi_2$ | $\theta_4$ |
| 1 | 4 | 3 | 4 | −1 | 0.069 | $\phi_3$ | $\theta_4$ |
| 1 | 4 | 4 | 0 | 1 | 0.069 | $\phi_4$ | $\theta_4$ |

In the single stage, i.e., M=1 design of Table 2, the stage number m=1 appears in the first column, the polyphase filter phase selection index, j, appears in the second column, the index of the sampling capacitor and coefficient sign appears in the third column, and a filter tap number or permutation index appears in the fourth column. The permutation index can be applied to select the coefficient sign and magnitude or capacitor ratio that appear in the fifth and sixth columns.

The sampling phase $\phi_{k,N(m)}$ for a given sampling element or FIR filter tap can vary according to the sampling element index k and the stage index m, where m is even. The output phase $\theta_{j,N(m)}$ for a given set of sampling elements or FIR filter taps for a given polyphase filter, i.e. a data bank, can vary according to the polyphase index j and the stage index m, where m is even.

Sampling and output phase timing pulses can be interleaved by approximately one-half of a sampling period. The sequence of sampling and output pulses, for an odd numbered FIR filter stage, e.g. m=1, with five coefficients, i.e. N(1)=4, can be: $\theta_0$, $\phi_0$, $\theta_1$, $\phi_1$, $\theta_2$, $\phi_2$, $\theta_4$, $\phi_3$, $\theta_4$ and $\phi_4$. Interchanging the roles of the $\phi$ and $\theta$ pulses in the second stage of a two stage FIR filter design allows FIR filter stages or signal processing subsystems to be cascaded without intervening buffer amplifiers.

Table 3 provides an exemplary low pass filter design that can be implemented with a single stage of compact switched-capacitor FIR filter. The coefficients, including sign, are different with this low pass filter design relative to the low pass differentiator design of Table 2. The sample phasing and output phase timing in Table 3 may be the same as Table 2 since both designs may use a single stage and may have the same number of taps.

TABLE 3

Single Stage Low Pass Filter

| 1 Stage m | 2 Poly-Phase j | 3 Sampled Data Element k | 4 Filter Tap # Mod(N(m) + 1 − j + k, N(m) + 1) | 5 Coefficient Sign $S_{j,k,m}$ | 6 Coefficient Magnitude $(C/C_F)_{j,k,m}$ | 7 Sampling Phase $\phi_{k,N(m)}$ | 8 Output Phase $\theta_{j,N(m)}$ |
|---|---|---|---|---|---|---|---|
| 1 | 0 | 0 | 0 | −1 | 0.087 | $\phi_0$ | $\theta_0$ |
| 1 | 0 | 1 | 1 | 1 | 0.229 | $\phi_1$ | $\theta_0$ |
| 1 | 0 | 2 | 2 | 1 | 0.715 | $\phi_2$ | $\theta_0$ |
| 1 | 0 | 3 | 3 | 1 | 0.229 | $\phi_3$ | $\theta_0$ |
| 1 | 0 | 4 | 4 | −1 | 0.087 | $\phi_4$ | $\theta_0$ |
| 1 | 1 | 0 | 4 | −1 | 0.087 | $\phi_0$ | $\theta_1$ |
| 1 | 1 | 1 | 0 | −1 | 0.087 | $\phi_1$ | $\theta_1$ |
| 1 | 1 | 2 | 1 | 1 | 0.229 | $\phi_2$ | $\theta_1$ |
| 1 | 1 | 3 | 2 | 1 | 0.715 | $\phi_3$ | $\theta_1$ |
| 1 | 1 | 4 | 3 | 1 | 0.229 | $\phi_4$ | $\theta_1$ |
| 1 | 2 | 0 | 3 | 1 | 0.229 | $\phi_0$ | $\theta_2$ |
| 1 | 2 | 1 | 4 | −1 | 0.087 | $\phi_1$ | $\theta_2$ |
| 1 | 2 | 2 | 0 | −1 | 0.087 | $\phi_2$ | $\theta_2$ |
| 1 | 2 | 3 | 1 | 1 | 0.229 | $\phi_3$ | $\theta_2$ |
| 1 | 2 | 4 | 2 | 1 | 0.715 | $\phi_4$ | $\theta_2$ |
| 1 | 3 | 0 | 2 | 1 | 0.715 | $\phi_0$ | $\theta_3$ |
| 1 | 3 | 1 | 3 | 1 | 0.229 | $\phi_1$ | $\theta_3$ |
| 1 | 3 | 2 | 4 | −1 | 0.087 | $\phi_2$ | $\theta_3$ |
| 1 | 3 | 3 | 0 | −1 | 0.087 | $\phi_3$ | $\theta_3$ |
| 1 | 3 | 4 | 1 | 1 | 0.229 | $\phi_4$ | $\theta_3$ |
| 1 | 4 | 0 | 1 | 1 | 0.229 | $\phi_0$ | $\theta_4$ |
| 1 | 4 | 1 | 2 | 1 | 0.715 | $\phi_1$ | $\theta_4$ |
| 1 | 4 | 2 | 3 | 1 | 0.229 | $\phi_2$ | $\theta_4$ |
| 1 | 4 | 3 | 4 | −1 | 0.087 | $\phi_3$ | $\theta_4$ |
| 1 | 4 | 4 | 0 | −1 | 0.087 | $\phi_4$ | $\theta_4$ |

Table 4 can provide an exemplary single stage design for a Hilbert transformer that can change the phase of signals by 90 degrees. The design represented by the coefficients in Table 4 can implement a narrow band filter centered a frequency equal to one-quarter of a sampling frequency. In other words, the design represented in Table 4 can phase shift an in-phase signal centered at one quarter of the sampling frequency to a quadrature signal at a same center frequency.

TABLE 4

Single Stage Narrow Band Hilbert Transformer

| 1 Stage m | 2 Poly-Phase j | 3 Sampled Data Element k | 4 Filter Tap # Mod(N(m) + 1 − j + k, N(m) + 1) | 5 Coefficient Sign $S_{j,k,m}$ | 6 Coefficient Magnitude $(C/C_F)_{j,k,m}$ | 7 Sampling Phase $\phi_{k,N(m)}$ | 8 Output Phase $\theta_{j,N(m)}$ |
|---|---|---|---|---|---|---|---|
| 1 | 0 | 0 | 0 | −1 | 0.5 | $\phi_0$ | $\theta_0$ |
| 1 | 0 | 1 | 1 | 1 | 0 | $\phi_1$ | $\theta_0$ |
| 1 | 0 | 2 | 2 | 1 | 0.5 | $\phi_2$ | $\theta_0$ |
| 1 | 1 | 0 | 2 | 1 | 0.5 | $\phi_0$ | $\theta_1$ |
| 1 | 1 | 1 | 0 | −1 | 0.5 | $\phi_1$ | $\theta_1$ |
| 1 | 1 | 2 | 1 | 1 | 0 | $\phi_2$ | $\theta_1$ |
| 1 | 2 | 0 | 1 | 1 | 0 | $\phi_0$ | $\theta_2$ |
| 1 | 2 | 1 | 2 | 1 | 0.5 | $\phi_1$ | $\theta_2$ |
| 1 | 2 | 2 | 0 | −1 | 0.5 | $\phi_2$ | $\theta_2$ |

Tables 5 and 6 represent coefficients that together may provide an exemplary case of a two-stage implementation of a low pass differentiator. A first stage in this instance may contain three filter taps and a second stage may contain two filter taps. This exemplary low pass differentiator has a bandwidth of about 15% of the sampling frequency, over which it may be used to measure the slope of an input signal, like the single stage low pass differentiator of Table 2.

TABLE 5

First Stage of a Two Stage Low Pass Differentiator; m is odd

| 1 Stage m | 2 Poly-Phase j | 3 Sampled Data Element k | 4 Filter Tap # Mod(N(m) + 1 − j + k, N(m) + 1) | 5 Coefficient Sign $S_{j,k,m}$ | 6 Coefficient Magnitude $(C/C_F)_{j,k,m}$ | 7 Sampling Phase $\phi_{k,N(m)}$ | 8 Output Phase $\theta_{j,N(m)}$ |
|---|---|---|---|---|---|---|---|
| 1 | 0 | 0 | 0 | 1 | 0.25 | φ0 | θ0 |
| 1 | 0 | 1 | 1 | 1 | 0.5 | φ1 | θ0 |
| 1 | 0 | 2 | 2 | 1 | 0.25 | φ2 | θ0 |
| 1 | 1 | 0 | 2 | 1 | 0.25 | φ0 | θ1 |
| 1 | 1 | 1 | 0 | 1 | 0.25 | φ1 | θ1 |
| 1 | 1 | 2 | 1 | 1 | 0.5 | φ2 | θ1 |
| 1 | 2 | 0 | 1 | 1 | 0.5 | φ0 | θ2 |
| 1 | 2 | 1 | 2 | 1 | 0.25 | φ1 | θ2 |
| 1 | 2 | 2 | 0 | 1 | 0.25 | φ2 | θ2 |

TABLE 6

Second Stage of a Two Stage Low Pass Differentiator; m is even

| 1 Stage m | 2 Poly-Phase j | 3 Sampled Data Element k | 4 Filter Tap # Mod(N(m) + 1 − j + k, N(m) + 1) | 5 Coefficient Sign $S_{j,k,m}$ | 6 Coefficient Magnitude $(C/C_F)_{j,k,m}$ | 7 Sampling Phase $\theta_{k,N(m)}$ | 8 Output Phase $\phi_{j,N(m)}$ |
|---|---|---|---|---|---|---|---|
| 2 | 0 | 0 | 0 | 1 | 1 | θ0 | φ0 |
| 2 | 0 | 1 | 1 | −1 | 1 | θ1 | φ0 |
| 2 | 1 | 0 | 1 | −1 | 1 | θ0 | φ1 |
| 2 | 1 | 1 | 0 | 1 | 1 | θ1 | φ1 |

Figure 6:
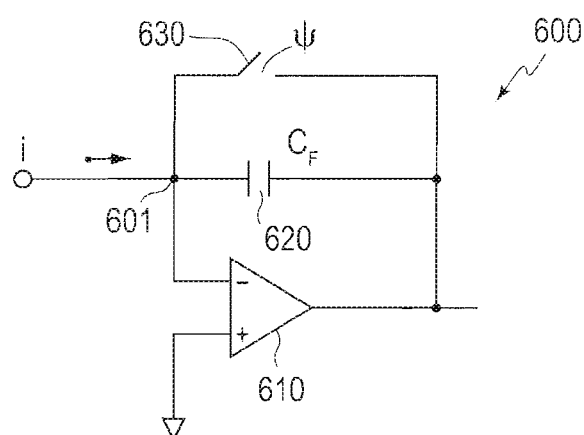
FIG. 6 schematically illustrates a summing amplifier to be included in a compact switch-capacitor FIR filter according to this disclosure.

FIG. 6 schematically illustrates a summing amplifier 600 to be included in a compact switched-capacitor FIR filter. As shown in FIG. 6, an exemplary summing amplifier 600 may include an operational amplifier 610, a feedback capacitor 620 and a zeroing switch 630. Summing amplifier 610 may receive an input signal, such as an input current, i.e., the derivative of charge with respect to time, and may connect the input signal to an inverting terminal of operational amplifier 610 and to a feedback capacitor 610. Feedback capacitor 610 may connect to an output terminal of operational amplifier 610. Zeroing switch 630 may be electrically in parallel to feedback capacitor 620. A non-inverting input terminal of operational amplifier 610 may connect to ground or to a reference voltage.

The exemplary summing amplifier 600 may be initialized by a zeroing clock signal Ψ from a sampler controller, such as that shown as element 204 in FIG. 2 that can be applied to close auto-zero switch 630. When auto-zero switch 630 is opened by such a sampler controller, feedback capacitor 620 can integrate current into the non-inverting terminal 601 of operational amplifier 610 so that the voltage at the non-inverting terminal 601 may be substantially equal to zero. When current ceases to flow into non-inverting terminal 601, operational amplifier 600 may hold a voltage approximately equal to the ratio of the capacitor charge divided by a capacitance of the feedback capacitor 620. Feedback capacitor 620 may hold a charge for a period substantially longer than a sampling period. In an exemplary case, feedback capacitor 620 can be a low-leakage capacitor with a leakage current less than one percent of the maximum input current to summing amplifier 600.

It should be appreciated that summing amplifier 600 may be used as a summing amplifier at any intermediate stage of a compact switched capacitor FIR filter. Summing amplifier 600 can be implemented with an operational amplifier with a low input bias current and a low-leakage feedback capacitor.

Figure 7:
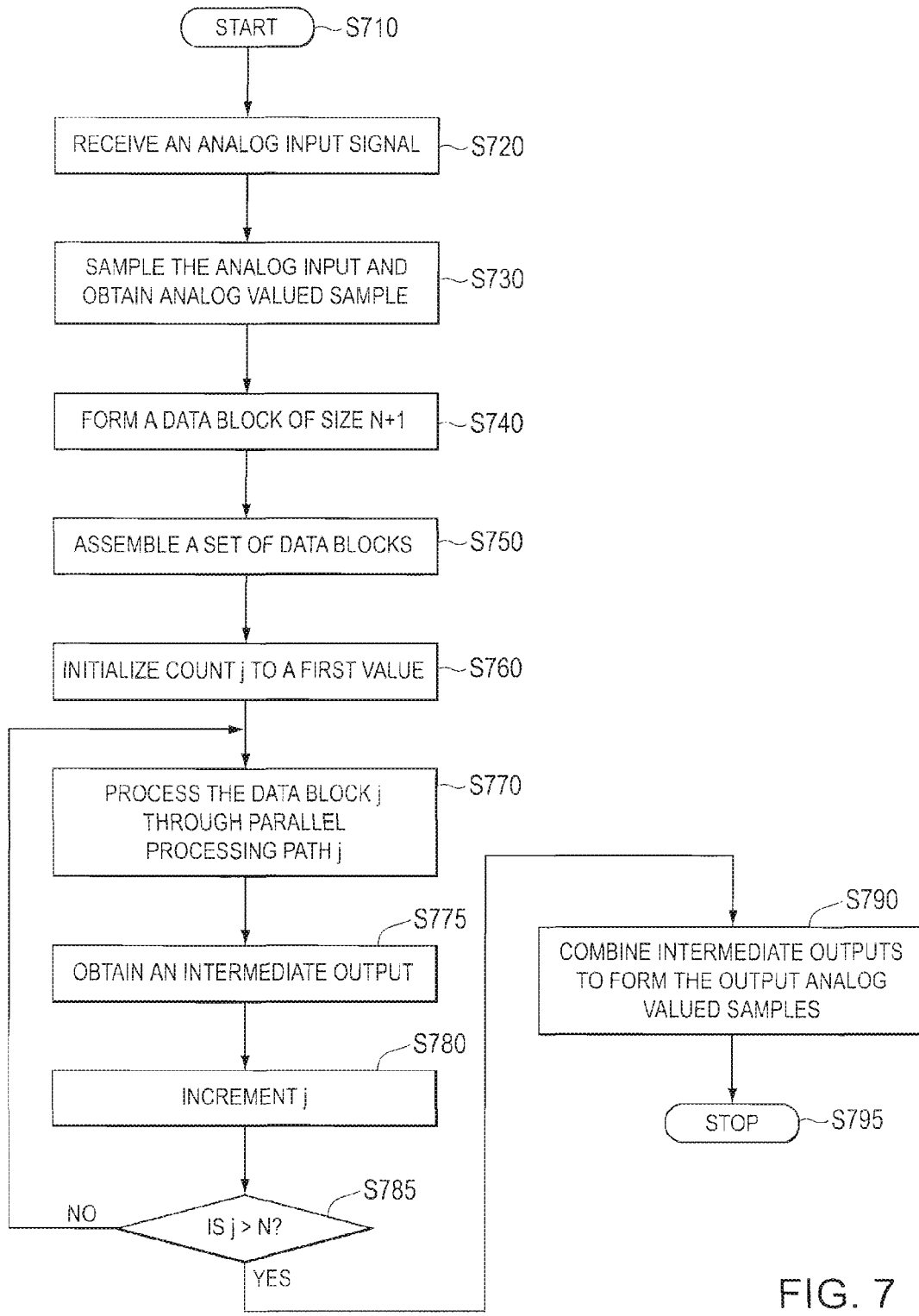
FIG. 7 is a flow diagram depicting an exemplary method for executing a non-recursive signal-processing task using multiple parallel processing paths according to this current disclosure.

FIG. 7 is a flow diagram depicting an exemplary method 700 for executing a non-recursive signal-processing task using multiple parallel processing paths according to the current disclosure. As shown in FIG. 7, operation of the method commences a step S710 and proceeds to step S720.

In step S720, an analog input signal may be received. The input signal may be inverted so both a non-inverted and an inverted input signal may be processed. Operation of the method proceeds to step S730.

In step S730, the analog input signal may be sampled and an analog valued sample obtained. Sampling may be nearly instantaneous or may occur over a small fraction of a sampling period. Operation of the method continues to step S740.

In step S740, a data block of size N+1 may be formed. Formation of a data block may occur by sequencing N+1 timing pulses. Operation of the method proceeds to step S750.

In step S750, a set of data blocks may be assembled from previously formed data blocks. A data block set may contain N+1 data blocks. Each data block may correspond to an output phase. Operation of the method continues to step S760.

In step S760, a counter may be initialized to a first value. The counter may be an index variable, such as j. The first value may correspond to the lowest output phase. Operation of the method continues to step S770.

In step S770, a $k^{th}$ data block may be processed through a $k^{th}$ parallel processing path. The $j^{th}$ processing path may hold N+1 stored samples. Operation of the method proceeds to step S775.

In step S775, an intermediate output may be obtained. The intermediate output may be a charge or a current from a storage element. Operation of the method proceeds to step S780.

In step S780, an index of a parallel processing branch count j may be incremented. Operation of the method continues to step S785.

In step S785, the index of the parallel processing branch, j, may be compared to a value N. The value N may depend on the order of a polynomial describing a factor of a factorized desired FIR filter polynomial, i.e., N can be N(m) representing the order of a subfilter or filter stage, where m=1, . . . , M.

If in step S785, the index of the parallel processing branch, j, is determined to not be greater than N, then operation of the method reverts to step S775.

If in step S785, the index of the parallel-processing branch j, is determined to be greater than N, operation of the method proceeds to step S790.

In step S790, the intermediate outputs may be combined to form the output analog valued samples. Combining intermediate outputs may be summing charge and holding the sum. Operation of the method proceeds to step S795 where operation of the method ceases.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims. These and other features and advantages of this proposal are described or are apparent from the above detailed description of the preferred embodiments. Various changes may be made without departing from the spirit and scope of this invention as defined in the following claims.

What is claimed is:

1. A method comprising:
   receiving an analog input signal;
   sampling the analog input signal in a time sequence manner at regular time intervals in order to obtain analog-valued samples;
   forming a plurality of data blocks by collecting for each of the plurality of the data blocks a plurality of the analog-valued samples;
   assembling a set of the plurality of the data blocks,
   wherein the set of data blocks includes a first data block and each successive data block of the set is offset in time in relation to each data block in the set such that successive data blocks are at least partially overlapping with a first data block; and
   performing a non-recursive signal processing on all of the data blocks of the set substantially simultaneously, using a network of switched capacitor filters, in order to produce a processed analog output signal.

2. The method of claim 1, forming the plurality of data blocks further comprising:
   establishing a degree of a polynomial representing a non-recursive signal processing task; and
   collecting a number of the plurality of the analog-valued samples in each data block equal to one plus the degree of the polynomial representing the non-recursive signal processing task,
   wherein each data block has at least a first analog-valued sample and a last analog-valued sample and each analog-valued sample is represented by a time sequence index represented by an integer.

3. The method of claim 2, wherein the assembling the set of the plurality of data blocks comprises assembling a number of the plurality of data blocks in the set equal to one plus the degree of the polynomial representing the non-recursive signal processing task.

4. The method of claim 3, wherein each data block in the set at least partially overlaps an immediately preceding data block by aligning the first analog-valued sample of each data block with a second analog-valued sample of the immediately preceding data block.

5. The method of claim 2, the non-recursive signal processing comprising:
   processing all of the plurality of the data blocks belonging to the set substantially simultaneously via a number of individual signal processing paths, organized in parallel, the number being equal to one plus a degree of a polynomial representing the non-recursive signal processing task, the non-recursive signal processing task on each data block being performed by a corresponding signal processing path;
   obtaining intermediate outputs of all the signal processing paths substantially in parallel; and
   combining the intermediate outputs to produce a processed analog output signal.

6. The method of claim 5, wherein the non-recursive signal processing is a linear-phase Finite Impulse Response (FIR) filtering operation.

7. A system comprising:
   an analog signal source that generates an analog input signal to be processed;
   a sampler that samples the analog input signal in a time sequence manner at regular time intervals in order to obtain a stream of analog-valued samples;
   a data block forming unit that forms a data block by collecting a plurality of the analog-valued samples;
   a data block set assembling unit that assembles a plurality of the data blocks into a set of data blocks; and
   a parallel processing network of switched capacitor filters to process all the data blocks in the set of data blocks, the parallel processing network performing a non-recursive signal processing on all the data blocks of the set substantially simultaneously in order to produce a processed analog output signal.

8. The system of claim 7, wherein a number of the analog-valued samples in the data block is equal to one plus a degree of a polynomial representing the non-recursive signal processing.

9. The system of claim 8, wherein each data block has at least a first analog-valued sample and a last analog-valued sample and each analog-valued sample is represented by a time sequence index represented by an integer.

10. The system of claim 7, wherein the non-recursive signal processing is performed by a linear-phase Finite Impulse Response (FIR) filter.

11. A system comprising:
    an analog signal source that generates an input signal to be processed;
    a plurality of non-recursive sub-systems constituting the system,
    wherein the plurality of non-recursive sub-systems comprises at least a first sub-system and a last sub-system, each of the non-recursive subsystems comprising:
    a sampler that samples the analog input signal in a time sequence manner at regular time intervals in order to obtain a stream of analog-valued samples;
    a data block forming unit that forms a data block by collecting a plurality of the analog-valued samples;
    a data block set assembling unit that assembles a set of a plurality of the data blocks; and
    a parallel processing network of switched capacitor filters to process all the data blocks in the set performing a non-recursive signal processing on all the data blocks in the set substantially simultaneously in order to produce a processed analog output signal.

12. The system of claim 11, wherein each of the non-recursive sub-systems is of a lesser complexity than the system.

13. The system of claim 11, comprising each of the non-recursive sub-systems either represents a polynomial of fourth degree or less.

14. The system of claim 11, further comprising a pipelining system in order to implement the non-recursive sub-systems such that a signal processing throughput of the pipelining system is limited by a largest of the non-recursive sub-systems.

* * * * *